(12) United States Patent
Kim et al.

(10) Patent No.: US 8,238,164 B2
(45) Date of Patent: Aug. 7, 2012

(54) METHOD OF PROGRAMMING NONVOLATILE MEMORY DEVICE

(75) Inventors: Min Seok Kim, Gwangju (KR); Jin Man Han, Seongnam-si (KR); Ki Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 12/916,755

(22) Filed: Nov. 1, 2010

(65) Prior Publication Data

US 2011/0110154 A1 May 12, 2011

(30) Foreign Application Priority Data

Nov. 11, 2009 (KR) ........................ 10-2009-0108544

(51) Int. Cl.
*G11C 11/34* (2006.01)
(52) U.S. Cl. .......... 365/185.22; 365/185.19; 365/185.29
(58) Field of Classification Search ............. 365/185.22, 365/185.19, 185.29
See application file for complete search history.

(56) References Cited

U.S. PATENT DOCUMENTS

| 6,091,640 | A | 7/2000 | Kawahara et al. | |
|---|---|---|---|---|
| 7,460,406 | B2 * | 12/2008 | Mokhlesi et al. | 365/185.21 |
| 7,499,332 | B2 * | 3/2009 | Crippa et al. | 365/185.22 |
| 7,596,022 | B2 * | 9/2009 | Chae et al. | 365/185.03 |
| 7,616,481 | B2 * | 11/2009 | Mokhlesi et al. | 365/185.03 |
| 2009/0016104 | A1 | 1/2009 | Kim | |

FOREIGN PATENT DOCUMENTS

| JP | 10106276 A | 4/1998 |
|---|---|---|
| JP | 2000163976 A | 6/2000 |
| KR | 1019980025111 A | 7/1998 |
| KR | 1020090005550 A | 1/2009 |

* cited by examiner

*Primary Examiner* — Son Dinh
(74) *Attorney, Agent, or Firm* — Volentine & Whitt, PLLC

(57) ABSTRACT

A method of programming a nonvolatile memory device comprises applying a gradually increasing program voltage to a memory cell, determining the number of verify voltages to be applied to the memory cell during a program loop based on the change of a threshold voltage from an initial state of the memory cell to a target state, and applying at least one of the determined verify voltages to the memory cell to verify whether the memory cell is programmed to the target state.

20 Claims, 13 Drawing Sheets

METHOD OF PROGRAMMING NONVOLATILE MEMORY DEVICE

CROSS-REFERENCE TO RELATED APPLICATIONS

This application claims priority under 35 U.S.C. §119 to Korean Patent Application No. 10-2009-0108544 filed on Nov. 11, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices and methods of programming the nonvolatile memory devices.

Semiconductor memory devices can be roughly divided into two categories based on whether or not they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM) and static random access memory (SRAM), and examples of nonvolatile memory devices include erasable programmable read only memory (EEPROM), ferroelectric random access memory (FRAM), phase change random access memory (PRAM), and flash memory.

In recent years, the number of electronic devices employing flash memory has increased dramatically. For instance, many modern devices now use flash memory as a primary or secondary source of long term data storage. Examples of such devices include various MP3 players, digital cameras, cellular phones, camcorders, flash cards, and solid state disks (SSD), to name just a few.

In response to the increasing demand for flash memory, researchers have developed a number of approaches for increasing the storage capacity of flash memories. One of these approaches involves storing more than one bit of data per memory cell. A flash memory device that stores more than one bit per memory cell is referred to as a multi-level cell (MLC) flash memory.

A flash memory cell can be programmed with multiple bits of data by adjusting its threshold voltage between multiple different states. For instance, a flash memory cell can be programmed to store two bits of data by adjusting its threshold voltage between four states, or ranges, corresponding to different values of the two bits, such as "00", "01", "10", and "11".

In order to accurately read data from a memory cell storing more than one bit, a MLC flash memory must be able to reliably distinguish between the different threshold voltage states. One way to ensure that the states can be distinguished from each other is to maintain sufficiently large read margins between the states. In other words, the ranges of threshold voltages that correspond to each state must be separated from each other by a large enough margin to prevent them from being confounded under a variety of circumstances.

One way to ensure adequate read margins between the threshold voltage states of a memory cell storing multiple bits is to program the memory cell using an incremental step pulse programming (ISPP) scheme. In the ISPP scheme, multiple program loops are performed on the memory cell to incrementally adjust its threshold voltage to within a desired range. In conventional ISPP schemes, each program loop typically comprises a program step in which an incrementally adjusted program pulse is applied to the memory cell to change its threshold voltage by a gradual amount, and a verify step that verifies whether the threshold voltage has arrived at the desired range.

SUMMARY

Embodiments of the inventive concept provide various methods of programming nonvolatile memory devices. In certain embodiments, a selected memory cell is programmed using a variable number of verify read operations based on a difference between an initial threshold voltage of the selected memory cell and a target threshold voltage of the selected memory cell.

According to one embodiment of the inventive concept, a method of programming a nonvolatile memory device comprises applying program voltage to a memory cell, determining a number of verify voltages to be applied to the memory cell based on a difference between a threshold voltage of an initial state of the memory cell and a threshold voltage of a target state, and applying the verify voltages to the memory cell to verify whether the memory cell is programmed to the target state.

In certain embodiments, the number of verify voltages to be applied to the memory cell is at least two where the difference is greater than a reference value.

In certain embodiments, the verify voltages to be applied to the memory cell comprise a pre-verify voltage that is higher than the threshold voltage of the initial state and lower than the threshold voltage of the target state, and a target verify voltage that is higher than the pre-verify voltage.

In certain embodiments, a bitline forcing voltage is applied to a bitline connected to the memory cell during a next program loop if the threshold voltage of the memory cell after a current program loop is higher than the pre-verify voltage and lower than the target verify voltage.

In certain embodiments, a ground voltage is applied to a bitline connected to the memory cell during a next program loop if the threshold voltage of the memory cell after a current program loop is lower than the target verify voltage.

In certain embodiments, a program inhibit voltage is applied to a bitline connected to the memory cell during a next program loop if the threshold voltage of the memory cell after a current program loop is higher than the target verify voltage.

In certain embodiments, the number of verify voltages to be applied to the memory cell is one where the difference is smaller than a reference value.

In certain embodiments, the memory cell stores at least two bits of data.

In certain embodiments, the nonvolatile memory device comprises a solid-state drive.

According to another embodiment of the inventive concept, a method of programming a nonvolatile memory device using an incremental step pulse programming scheme is provided. The method comprises programming memory cells from an erase state to a first state having a verify voltage higher than the erase state, based on a least significant bit, and programming the memory cells from the first state to a second state having a verify voltage higher than the first state, based on a most significant bit, wherein programming the memory cells from the first state to the second state comprises selecting a number of verify voltages to be applied to the memory cells in one or more program loops of the incremental step pulse programming scheme based on a difference between a threshold voltage of the first state and a threshold voltage of the second state.

In certain embodiments, the number of verify voltages to be applied to the memory cells is at least two where the difference is greater than a reference value.

In certain embodiments, the verify voltages to be applied to the memory cells comprises a pre-verify voltage that is higher than the threshold voltage of the first state and lower than the threshold voltage of the second state.

In certain embodiments, a ground voltage is applied to a bitline connected to the memory cells programmed to the second state during a next program loop if a threshold voltage of the memory cells programmed to the second state is lower than the pre-verify voltage after a current program loop.

In certain embodiments, a bitline forcing voltage is applied to a bitlines connected to the memory cells programmed to the second state during a next program loop if a threshold voltage of the memory cells programmed to the second state is higher than the pre-verify voltage and lower than a target verify voltage after a current program loop.

In certain embodiments, a program inhibit voltage is applied to a bitline connected to the memory cells programmed to the second state during a next program loop if a threshold voltage of the memory cells programmed to the second state is higher than a target verify voltage after a current program loop.

In certain embodiments, the number of verify voltages to be applied to the memory cell is one where the difference is smaller than a reference value.

In certain embodiments, the memory cells are programmed from the erase state to the first state using a convergence program operation.

In certain embodiments, at least one of the memory cells is a two-bit memory cell.

In certain embodiments, the nonvolatile memory device comprises a solid-state drive.

According to another embodiment of the inventive concept, a method of programming a nonvolatile memory device using an incremental step pulse programming scheme is provided. The method comprises determining a threshold voltage shift distance between a first threshold voltage state of a selected memory cell and a second threshold voltage state of the selected memory cell, and comparing the threshold voltage shift distance against a reference value to determine whether the threshold voltage shift distance is greater than the reference value. The method further comprises, as a consequence of determining that the threshold voltage shift distance is greater than the reference value, programming the selected memory cell from the first threshold voltage state to the second threshold voltage state by executing the ISPP scheme with at least one program loop using more than one verify voltage, and as a consequence of determining that the threshold voltage shift distance is not greater than the reference value, programming the selected memory cell from the first threshold voltage state to the second threshold voltage state by executing the ISPP scheme with at only one verify voltage in each program loop.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Selected embodiments of the inventive concept are described below with reference to the corresponding drawings. These embodiments are presented as teaching examples and should not be construed to limit the scope of the inventive concept.

Figure 1:
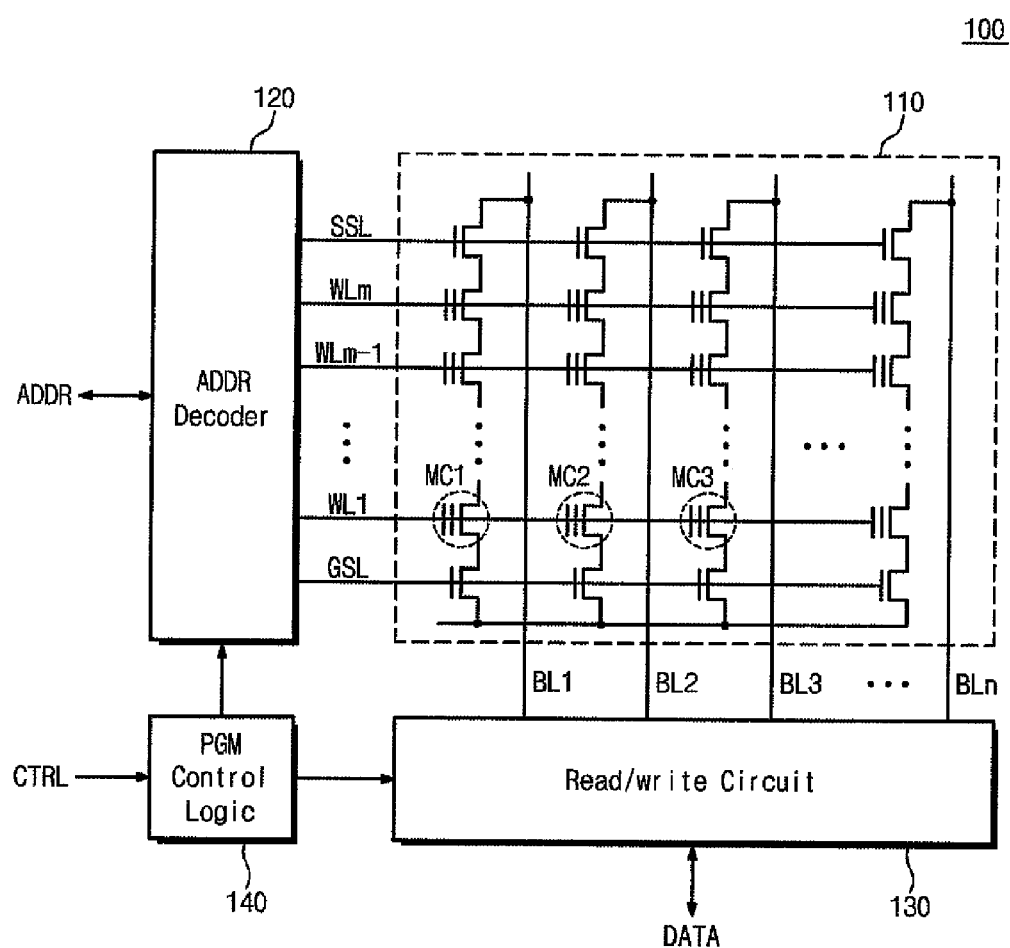
FIG. 1 is a block diagram of a nonvolatile memory according to an embodiment of the inventive concept.

FIG. 1 is a block diagram of a nonvolatile memory 100 according to an embodiment of the inventive concept. In the embodiment of FIG. 1, nonvolatile memory 100 comprises a memory cell array 110, an address decoder 120, a read/write circuit 130, and program control logic 140.

Memory cell array 110 comprises a plurality of memory cells. Each of the memory cells stores data transferred from read/write circuit 130. Each of the memory cells can store one or more bits of data. In other words, in various embodiments, the memory cells can be 1-bit memory cells, 2-bit memory cells, and so on. Each of the memory cells is connected to address decoder 120 through a wordline WL.

For explanation purposes, it will be assumed that first through third memory cells MC1~MC3 are programmed to have threshold voltages corresponding to first through third states P1~P3, respectively. First through third memory cells MC1~MC3 are programmed using an ISPP scheme, such as those described below with reference to FIGS. 2 to 7.

Address decoder 120 is connected to memory cell array 110 through wordlines WL1~WLm. Address decoder 120 is controlled by program control logic 140. Address decoder 120 receives an address ADDR from an external source. Address ADDR typically comprises a row address and a column address.

Address decoder 120 decodes address ADDR to acquire the row address, and selects wordlines based on the row address. Address decoder 120 also decodes address ADDR to acquire the column address, and transfers the column address to read/write circuit 130. Read/write circuit 130 selects bitlines BL based on the column address.

Read/write circuit 130 operates under the control of program control logic 140. Read/write circuit 130 is connected to memory cell array 110 through bitlines BL1~BLn. Read/write circuit 130 receives data from an external source and stores the received data in memory cell array 110. Read/write circuit 130 also reads data stored in memory cell array 110 and transfers the read data to an external destination. In various embodiments, read/write circuit 130 comprises components such as a column select gate, a page buffer, a write driver, a sense amplifier, and a data buffer.

Program control logic 140 operates according to a control signal CTRL received from an external source, and controls read/write circuit 130 and address decoder 120 based on control signal CTRL.

In a program operation of nonvolatile memory 100, program control logic 140 selects an ISPP scheme according to an amount by which the threshold voltage of a selected memory cell is to be shifted in the program operation. This amount is referred to as a threshold voltage shift distance. In certain embodiments, program logic 140 selects an ISPP scheme that uses multiple different verify operations in each program loop if the threshold voltage of the selected memory cell is to be shifted by a relatively large amount, and selects an ISPP scheme that uses only one verify operation per program loop if the threshold voltage of the selected memory cell is to be shifted by a relatively small amount, such as from one state to an adjacent state. Various alternative ISPP schemes that can be selected by program control logic will be presented below with reference to FIGS. 2, 5, and 6.

Figure 2:
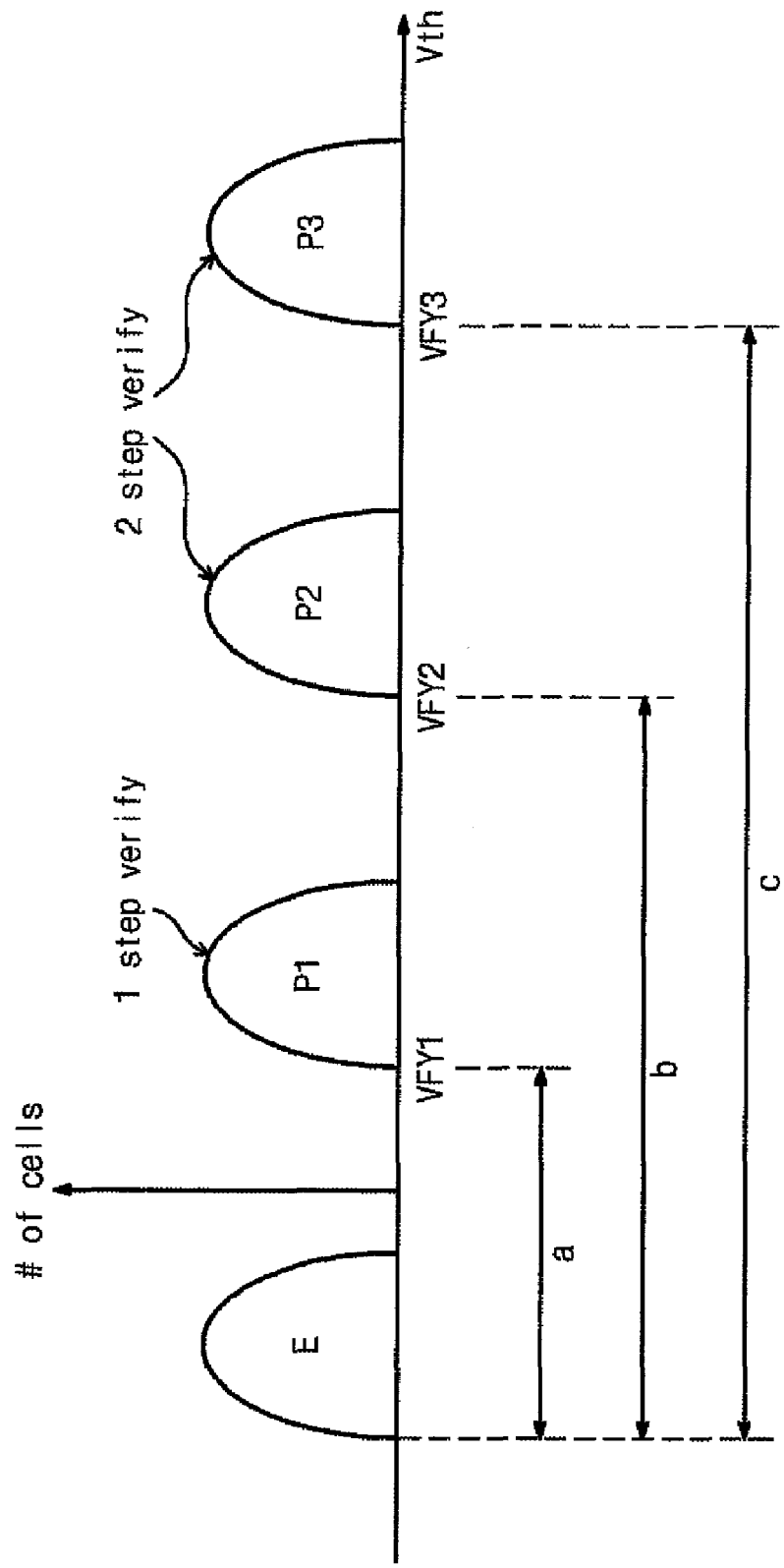
FIG. 2 is a threshold voltage diagram illustrating different threshold voltage states of memory cells according to an embodiment of the inventive concept.

FIG. 2 is a threshold voltage diagram illustrating different threshold voltage states of memory cells according to an embodiment of the inventive concept. In FIG. 2, the vertical axis represents threshold voltage and the horizontal axis represents a number of memory cells.

In the example of FIG. 2, it is assumed that memory cells are programmed to one of four states E, P1, P2, and P3 based on their threshold voltages. In addition, it is assumed that memory cells are programmed to first through third states P1~P3 from an erase state E. Memory cells to be programmed from erase state E to first state P1 have a shift distance 'a'. In other words, their threshold voltages shift to at least a distance least 'a' from a lowest threshold voltage in erase state E. Memory cells to be programmed from erase state E to second and third states P2 and P3 have shift distances 'b' and 'c', respectively.

In certain embodiments, where the threshold voltage shift distance of a program operation is relatively short, memory cells are programmed by an ISPP scheme using a 1-step verify method, and where the threshold voltage shift distance is relatively long, memory cells are programmed by an ISPP scheme using a 2-step verify method.

In the example of FIG. 2, for instance, memory cells are programmed from erase state E to first state P1 using the ISPP scheme with the 1-step verify method because threshold voltage shift distance 'a' is relatively short. On the other hand, memory cells are programmed from erase state to second or third state P2 or P3 using the 2-step verify method because threshold voltage shift distances 'b' and 'c' are relatively long.

In certain embodiments, the ISPP scheme is selected by comparing a threshold voltage shift distance of a program operation against a reference distance 'r'. Reference distance 'r' can be flexibly set based on, e.g., properties of a memory device to be programmed or desired performance characteristics.

In the example of FIG. 2, for instance, reference distance 'r' can be set so that shift distance 'b' is greater than reference distance 'r' (r<b). In this case, memory cells to be programmed to second state P2 can be programmed by the ISPP scheme using a 2-step verify method. Alternatively, reference distance 'r' can be set so that shift distance 'b' is shorter than reference distance 'r' (r>b). In this case, memory cells to be programmed to second state P2 can be programmed by the ISPP scheme using a 1-step verify method.

In some embodiments, the ISPP scheme is performed after a convergence program operation. The convergence program operation is an operation used to shift a threshold voltage of memory cells to the vicinity of a target state before ISPP is performed. For instance, memory cells to be programmed to first state P1 can be programmed by the ISPP scheme using a 1-step verify method after execution of a convergence program operation.

Figure 3:
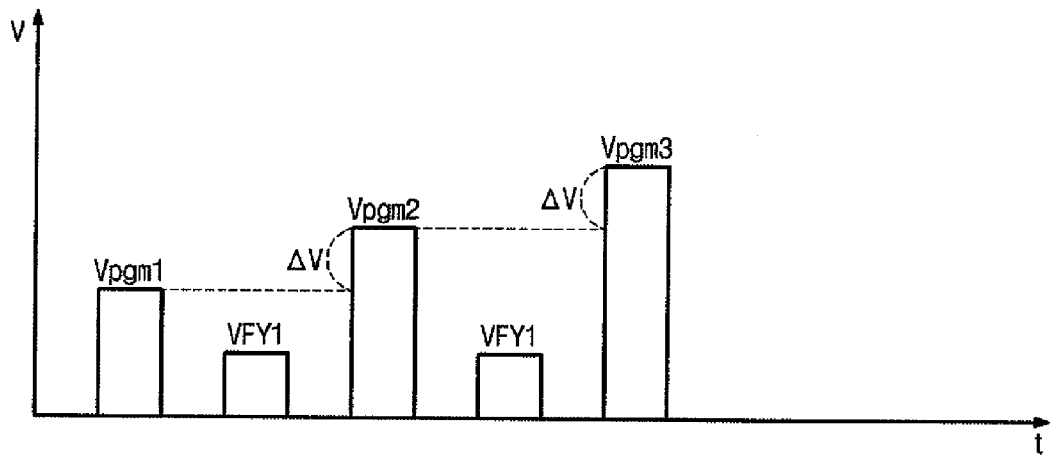
FIG. 3 is a voltage diagram illustrating program and verify voltages used in an ISPP scheme according to an embodiment of the inventive concept.
Figure 4:
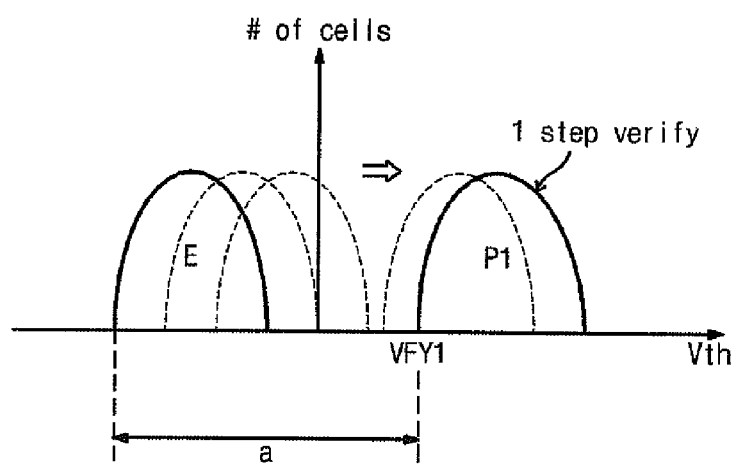
FIG. 4 is a threshold voltage diagram illustrating threshold voltage distributions of memory cells programmed by the ISPP scheme in FIG. 3.

FIG. 3 is a voltage diagram illustrating program and verify voltages used in an ISPP scheme according to an embodiment of the inventive concept. FIG. 4 is a threshold voltage diagram illustrating threshold voltage distributions of memory cells programmed by the ISPP scheme in FIG. 3.

In the example of FIGS. 3 and 4, it will be assumed that the ISPP scheme of FIGS. 3 and 4 are used to program a first memory cell MC1 from erase state E to first state P1. Accordingly, the ISPP scheme of FIGS. 3 and 4 uses a 1-step verify method in each program loop.

The ISPP scheme of FIGS. 3 and 4 comprises a program step performed with a program voltage Vpgm that increases by a regular step $\Delta V$ in successive program loops. The ISPP scheme further comprises a 1-step verify method that uses a first verify voltage VFY1 in each program loop.

In the ISPP scheme of FIGS. 3 and 4, data is provided to read/write circuit 130. Then, a bitline bias operation is performed. For instance, first memory cell MC1 can be supplied with a ground voltage through a bitline BL1. Following the bitline bias operation, a program voltage is applied to a selected wordline. For instance, first memory cell MC1 can be supplied with a program voltage Vpgm1 through a wordline WL1.

After program voltage Vpgm1 is applied to the selected wordline, a 1-step verify method is performed to determine whether first memory cell MC1 is successfully programmed. In the verify method, first verify voltage VFY1 is applied to first memory cell MC1 through wordline WL1. Where the threshold voltage of first memory cell MC1 is lower than first verify voltage VFY1, a program voltage Vpgm2 is generated by increasing program voltage Vpgm1 by regular step $\Delta V$, and program voltage Vpgm2 is applied to first memory cell MC1. Thereafter, another 1-step verify method is performed with first verify voltage VFY1 to determine whether first memory cell MC1 has been successfully programmed. Further program loops are performed with successively increasing values of program voltage Vpgm until first memory cell MC1 is successfully programmed.

Figure 5:
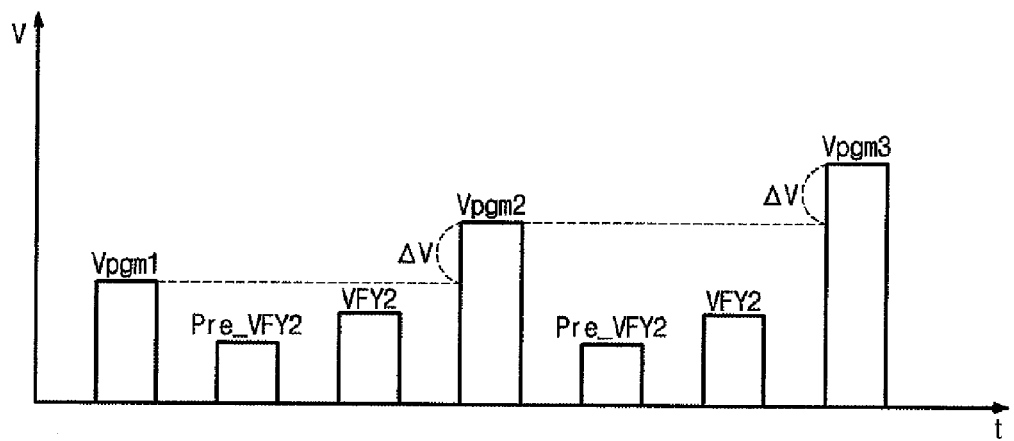
FIG. 5 is a voltage diagram illustrating program and verify voltages used in an ISPP scheme according to an embodiment of the inventive concept.
Figure 6:
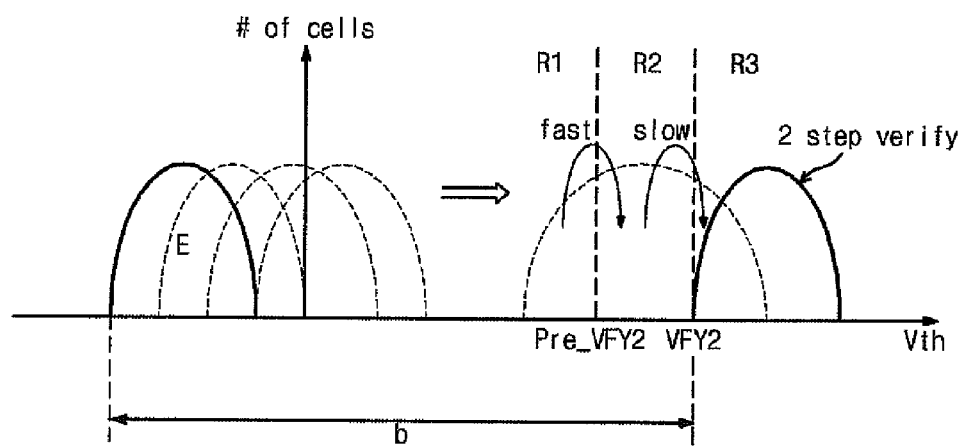
FIG. 6 is a threshold voltage diagram illustrating threshold voltage distributions of memory cells programmed by the ISPP scheme in FIG. 5.

FIG. 5 is a voltage diagram illustrating program and verify voltages used in an ISPP scheme according to an embodiment of the inventive concept. FIG. 6 is a threshold voltage diagram illustrating threshold voltage distributions of memory cells programmed by the ISPP scheme in FIG. 5.

In the example of FIGS. 5 and 6, it will be assumed that a second memory cell MC2 is programmed from erase state E to second state P2. Accordingly, the ISPP scheme is performed using a 2-step verify method in each program loop.

The ISPP scheme of FIGS. 5 and 6 comprises a program step performed with a program voltage Vpgm that increases by regular step ΔV in successive program loops. The ISPP scheme further comprises a 2-step verify method that uses a second pre-verify voltage Pre_VFY2 and a second verify voltage VFY2 in each program loop. In the 2-step verify method, the program speed of a selected memory cell can be adjusted depending on a threshold voltage region in which the memory cell are currently programmed.

In the ISPP scheme of FIGS. 5 and 6, data is applied to read/write circuit 130. Thereafter, a bitline bias operation is performed, for instance, by applying a ground voltage to second memory cell MC2 through a bitline BL2. After the bitline bias operation, program voltage Vpgm1 is applied to second memory cell MC2 through wordline WL1. Then, the ISPP scheme uses second pre-verify voltage Pre_VFY2 and second verify voltage VFY2 to determine a threshold voltage region in which second memory cell MC2 is currently programmed. As an example, FIG. 6 shows first through third threshold voltage regions R1~R3, where first threshold voltage region R1 comprises threshold voltages less than second pre-verify voltage Pre_VFY2, second threshold voltage region R2 comprises threshold voltages between second pre-verify voltage Pre_VFY2 and second verify voltage VFY2, and third threshold voltage region R3 comprises threshold voltages greater than second verify voltage VFY2.

To determine the threshold voltage region of second memory cell MC2, second pre-verify voltage Pre_VFY2 is applied to second memory cell MC2 through wordline WL1, and then second verify voltage VFY2 is applied to second memory cell MC2 through wordline WL1. The threshold voltage region of second memory cell MC2 is then used to determine the manner in which a bitline bias operation is performed in subsequent program loop.

Where the threshold voltage of second memory cell MC2 is in first region R1, the bitline bias operation is performed by supplying second memory cell MC2 with a ground voltage through bitline BL2. Second memory cell MC2 is then supplied with incremented program voltage Vpgm2 through wordline WL1.

Where the threshold voltage of second memory cell MC2 is in second region R2, the bitline bias operation is performed by supplying second memory cell MC2 with a voltage higher than the ground voltage through bitline BL2. The higher voltage can be, for instance, 1 volt. Second memory cell MC2 is then supplied with incremented program voltage Vpgm2 through wordline WL1.

By selectively performing the bitline bias operation with the ground voltage or the higher voltage, the threshold voltages of memory cells in first region R1 can be shifted by a larger amount than memory cells in second region R2.

Where the threshold voltage of second memory cell MC2 is in third region R3, second memory cell MC2 is successfully programmed. Accordingly, in a subsequent program loop, second memory cell MC2 is supplied with a program inhibit voltage Vcc through bitline BL2 to prevent it from being further programmed. The ISPP scheme continues to be performed in successive program loops until all selected memory cells are successfully programmed.

The embodiments of FIGS. 3 through 6 can be modified in a variety of ways. For example, the program voltage can be incremented by a greater amount in program operations with a greater threshold voltage shift distance. Accordingly, a different regular step can be used in the program operations using the 2-step verify method compared with program operations using the 1-step verify method. As another example, the ISPP scheme may verify method with a 3-step verify method, a 4-step verify method, and so on, depending on the threshold voltage shift distance of a program operation. Memory cells to be programmed from erase state E to third state P3 can use the ISPP scheme with the 2-step verify method, similar to the program operation described above with reference to memory cell MC2.

Figure 7:
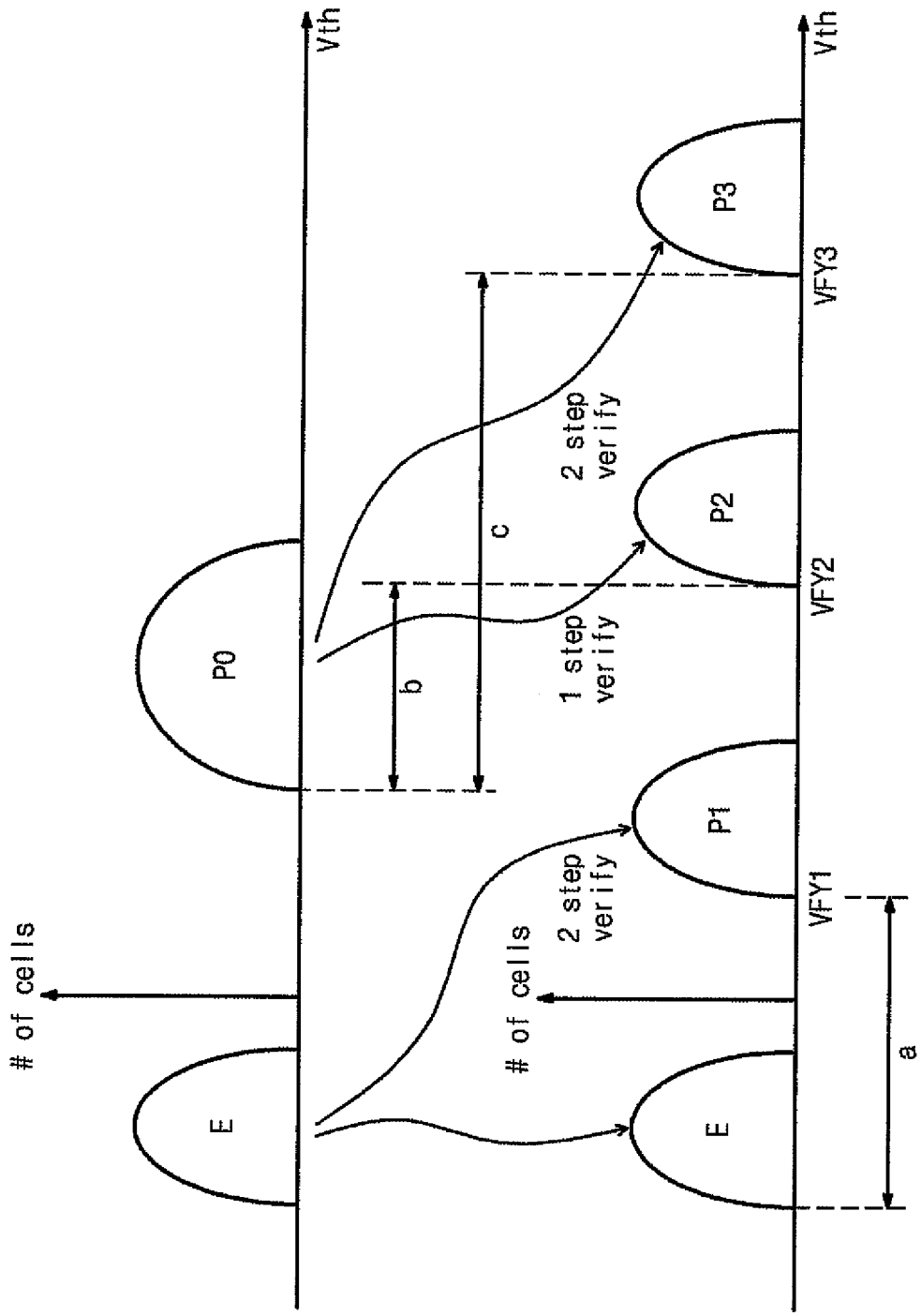
FIG. 7 is a threshold voltage diagram illustrating a method of programming 2-bit memory cells according to an embodiment of the inventive concept.

FIG. 7 is a threshold voltage diagram illustrating a method of programming 2-bit memory cells according to an embodiment of the inventive concept. In the method of FIG. 7, a most significant bit (MSB) is programmed after a least significant bit (LSB) is programmed. The method of FIG. 7 comprises steps similar to those described in relation to FIGS. 2 through 6, so the description of FIG. 7 will focus on aspects that are different from the embodiments of FIGS. 2 through 6.

Referring to FIG. 7, a program operation is performed to program an LSB as indicated by a top graph in FIG. 7. This program operation produces memory cells in erase state E or a state P0. Thereafter, a program operation is performed to program an MSB as indicated by curved arrows in FIG. 7. This program operation causes memory cells to either remain in erase state E, to change from erase state E to first state P1, or to change from state P0 to second state P2 or a third state P3.

A threshold voltage shift distance 'b' from state P0 to second state P2 is shorter than a threshold voltage shift distance 'c' from state P0 to third state P3. Accordingly, an ISPP scheme using a 1-step verify method can be applied to the memory cells to be programmed from state P0 to second state P2, and an ISSP scheme using a 2-step verify method can be applied to memory cells to be programmed from state P0 to third state P3.

A threshold voltage shift distance 'a' from erase state E to first state P1 is longer than threshold voltage shift distance 'b', so the ISPP scheme using the 2-step verify method can be applied to memory cells to be programmed to from erase state E to first state P1.

Figure 8:
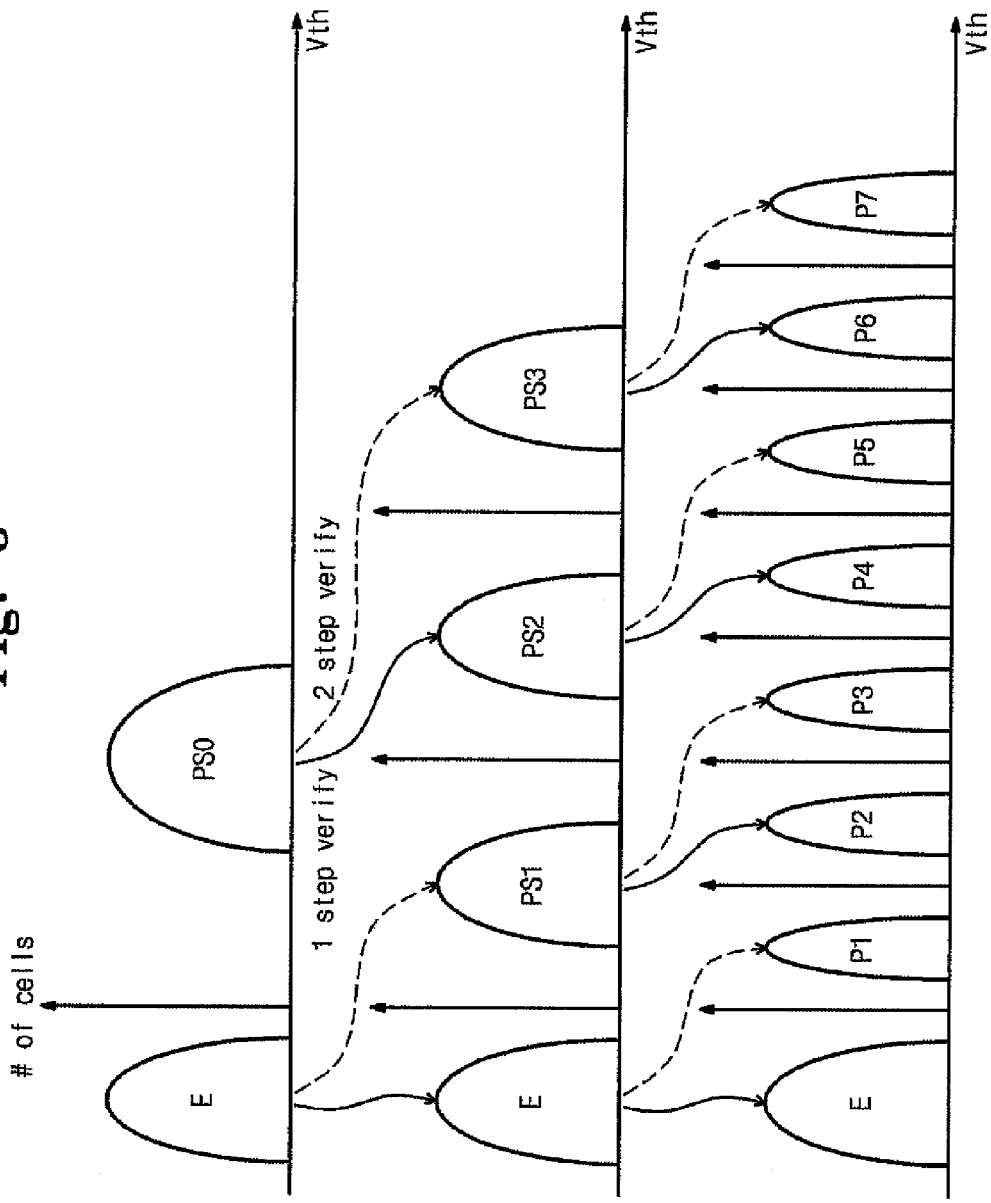
FIG. 8 is a threshold voltage diagram illustrating a method of programming 3-bit memory cells according to an embodiment of the inventive concept.

FIG. 8 is a threshold voltage diagram illustrating a method of programming 3-bit memory cells according to an embodiment of the inventive concept. In FIG. 8, solid arrows represent an ISPP scheme using a 1-step verify method and dotted arrows represent an ISPP scheme using a 2-step verify method. The method of FIG. 8 is performed similar to the method of FIG. 7, so a further description of FIG. 8 will be omitted to avoid redundancy.

Figure 9:
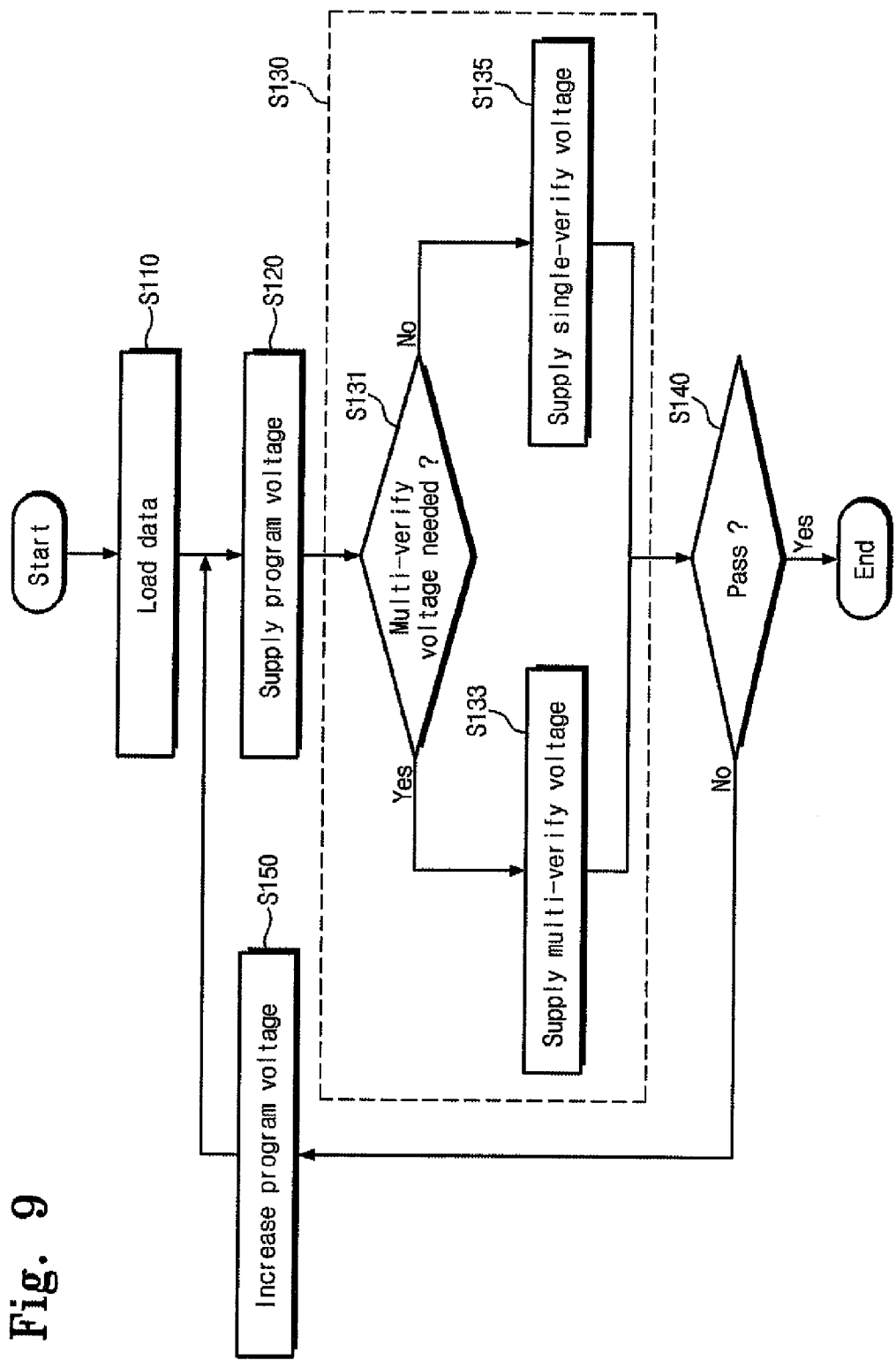
FIG. 9 is a flowchart illustrating a method of programming a nonvolatile memory device according to an embodiment of the inventive concept.

FIG. 9 is a flowchart illustrating a method of programming a nonvolatile memory device according to an embodiment of the inventive concept.

In the method of FIG. 9, data is loaded into read/write circuit 130 (S110). For instance, in the example of FIG. 1, data to be written into a page corresponding to a selected wordline WL1 is loaded into read/write circuit 130.

Program voltage Vpgm is then supplied to selected memory cells through a selected wordline (S120). For instance, in the example of FIG. 1, program voltage Vpgm is supplied to memory cells through the selected wordline WL1.

Next, a verify operation is performed (S130). The verify operation first determines whether a multi-verify voltage is required (S131). In other words, the verify operation determines whether a multi-step verify operation is to be performed using multiple different verify operations. In the example of FIG. 2, for instance, this is accomplished by determining whether a threshold voltage shift distance of the program operation is shorter than reference distance 'r'.

Where the multi-verify voltage is required, it is supplied to memory cells through a selected wordline (S133). For instance, in the examples of FIGS. 5 and 6, second pre-verify voltage Pre_VFY2 and second verify voltage VFY2 are supplied to memory cells through a selected wordline.

Where the multi-verify voltage is not required, a single-verify voltage is supplied to memory cells through a selected wordline (S135). For instance, in the example of FIGS. 3 and 4, first verify voltage VFY1 is supplied to memory cells through a selected wordline WL1.

Thereafter, the method determines whether the selected memory cells have been successfully programmed (S140). If not, program voltage Vpgm is incremented by regular step ΔV (S150), and the method returns to step S120.

Figure 10:
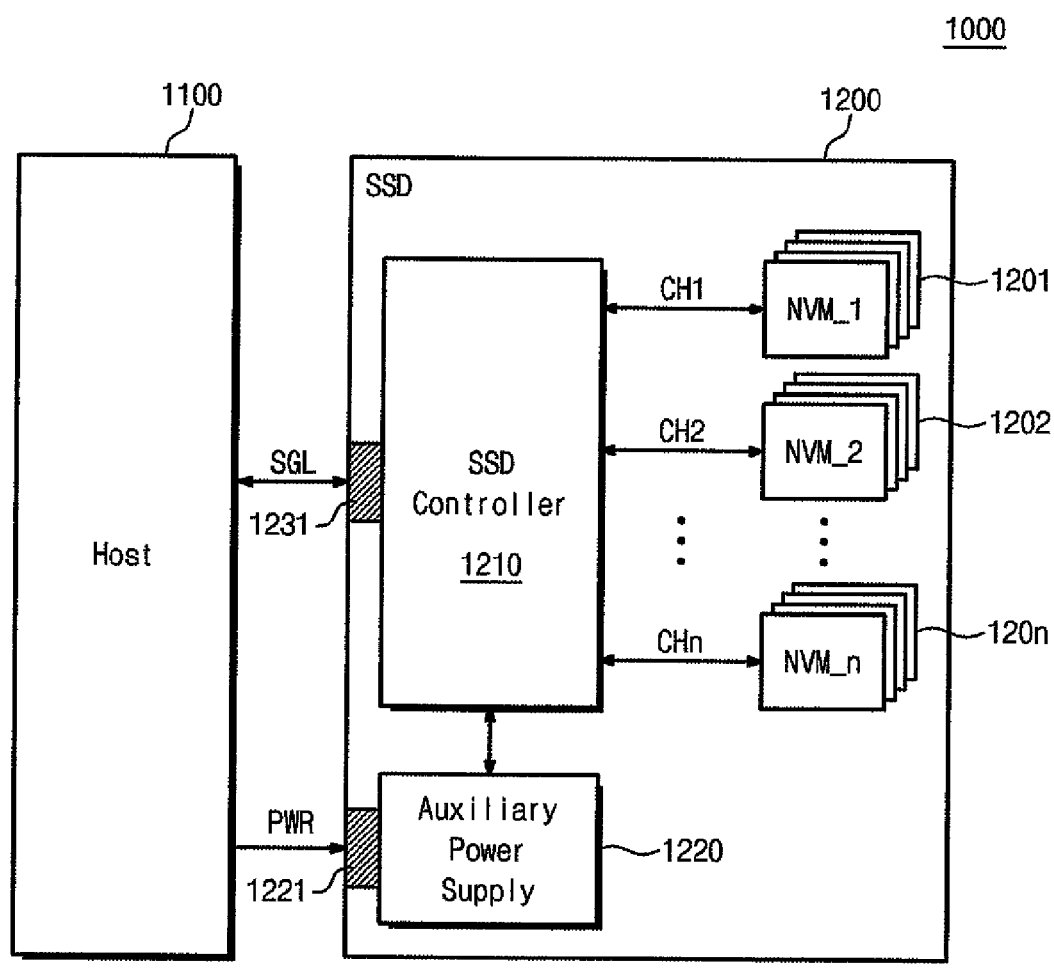
FIG. 10 is a block diagram of a data storage system comprising a solid state drive (SSD) according to an embodiment of the inventive concept.

FIG. 10 is a block diagram of a data storage system 1000 comprising an SSD 1200 according to an embodiment of the inventive concept. Referring to FIG. 10, data storage system 1000 comprises a host 1100 and SSD 1200. SSD 1200 transmits/receives signals to/from host 1100 through a signal connector 1211. SSD 1200 comprises a plurality of nonvolatile memory devices 1201~120n and an auxiliary power supply 1220.

Nonvolatile memory devices 1201~120n are used as storage media of SSD 1200. Nonvolatile memory devices 1201~120n can comprise, for instance, flash memory devices providing mass data storage. Nonvolatile memory devices 1201~120n can also comprise other types of memory, such as phase change random access memory (PRAM), magnetoresistive random access memory (MRAM), resistive random access memory (ReRAM), ferroelectric random access memory (FRAM), and others. In the embodiment of FIG. 10, at least one nonvolatile memory device can comprise a nonvolatile memory device 100 shown in FIG. 1 or 9.

Nonvolatile memory devices 1201~120n are connected to SSD controller 1210 through a plurality of channels CH1~CHn. At least one memory device is connected to one channel. Memory devices connected to the same channel can be connected to the same data bus.

SSD controller 1210 transmits/receives a signal SGL to/from host 1100 through a signal connector 1211. Signal SGL typically comprises a command, an address, and data. SSD controller 1210 reads/writes data from/to a corresponding memory device in response to a command of host 1100. An embodiment of SSD controller 1210 is described in further detail with reference to FIG. 11.

Auxiliary power supply 1220 is connected to host 1100 through a power connector 1221. Auxiliary power supply 1220 can be charged by receiving power PWR from host 1100. Auxiliary power supply 1220 can be disposed inside or outside SSD 1200. For instance, auxiliary power supply 1220 can be disposed at a main board to supply auxiliary power to SSD 1200.

Figure 11:
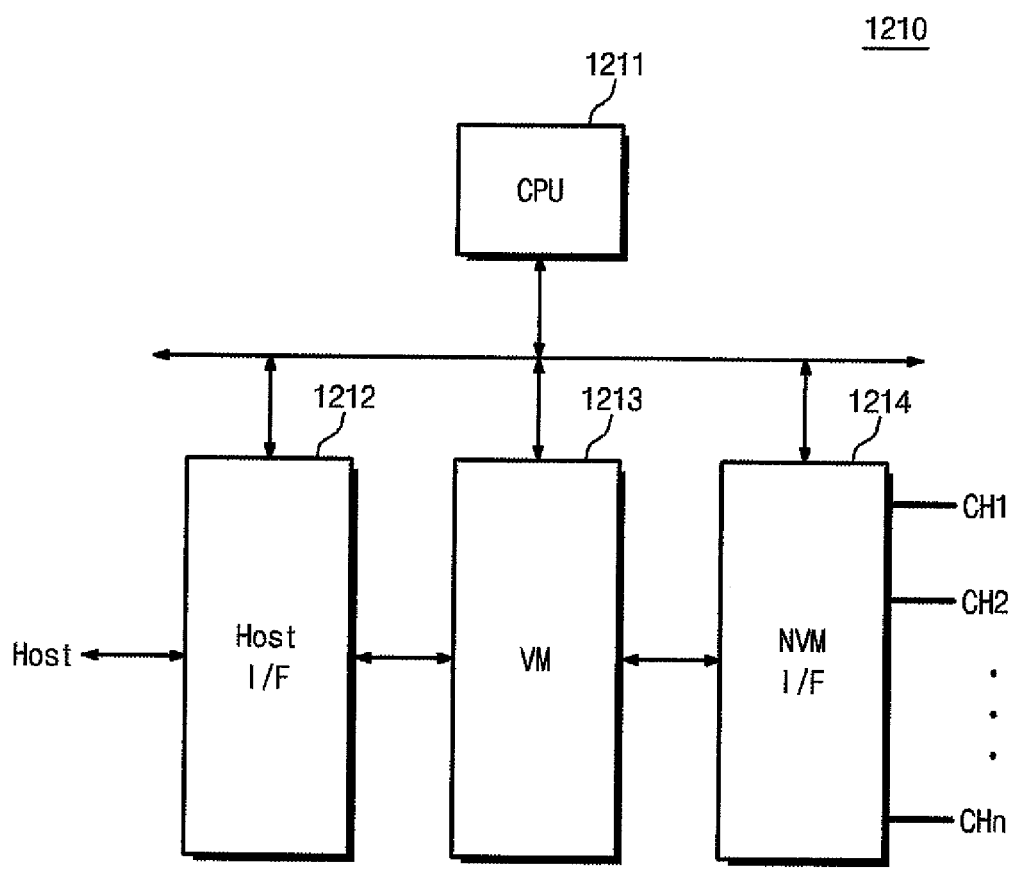
FIG. 11 is a block diagram illustrating an embodiment of an SSD controller shown in FIG. 10.

FIG. 11 is a block diagram illustrating an embodiment of SSD controller 1210 shown in FIG. 10. In the embodiment of FIG. 11, SSD controller 1210 comprises a central processing unit (CPU) 1211, a host interface (Host I/F) 1212, a volatile memory device (VM) 1213, and a nonvolatile memory interface (NVM I/F) 1214.

CPU 1211 analyzes and processes a signal SGL input from host 1100 shown in FIG. 10. CPU 1211 controls host 1100 or nonvolatile memory devices 1201~120n through host interface 1212 or nonvolatile memory interface 1214. CPU 1211 controls nonvolatile memory devices 1201~120n according to firmware for driving SSD 1200.

Host interface 1212 can use a protocol of host 1100 to interface with SSD 1200. For instance, host interface 1212 can communicate with host 1100 using a protocol such as universal serial bus (USB), small computer system interface (SCSI), PCI express, ATA, parallel ATA (PATA), serial ATA (SATA), and serial attached SCSI (SAS). Moreover, host interface 1212 can perform a disk emulation function to recognize SSD 1200 as a hard disk drive (HDD).

Volatile memory device 1213 temporarily stores write data provided from host 1100 or written data from a nonvolatile memory device. Volatile memory device 1213 may store metadata or cache data to be stored in nonvolatile memory devices 1201~120n. During a sudden power-off operation, meta data or cache data stored in volatile memory device 1213 is stored in nonvolatile memory devices 1201~120n. Volatile memory device 1213 can comprise, for instance, a DRAM or SRAM.

Nonvolatile memory interface 1214 scatters data transferred from volatile memory device 1213 to channels CH1~CHn. Nonvolatile memory interface 1214 transfers data read out of nonvolatile memory devices 1201~120n to volatile memory device 1213. Nonvolatile memory interface 1214 can adopt, for instance, a NAND flash memory interface. Accordingly, SSD controller 1210 can perform program, read or erase operations to the requirements of a NAND flash memory interface.

Figure 12:
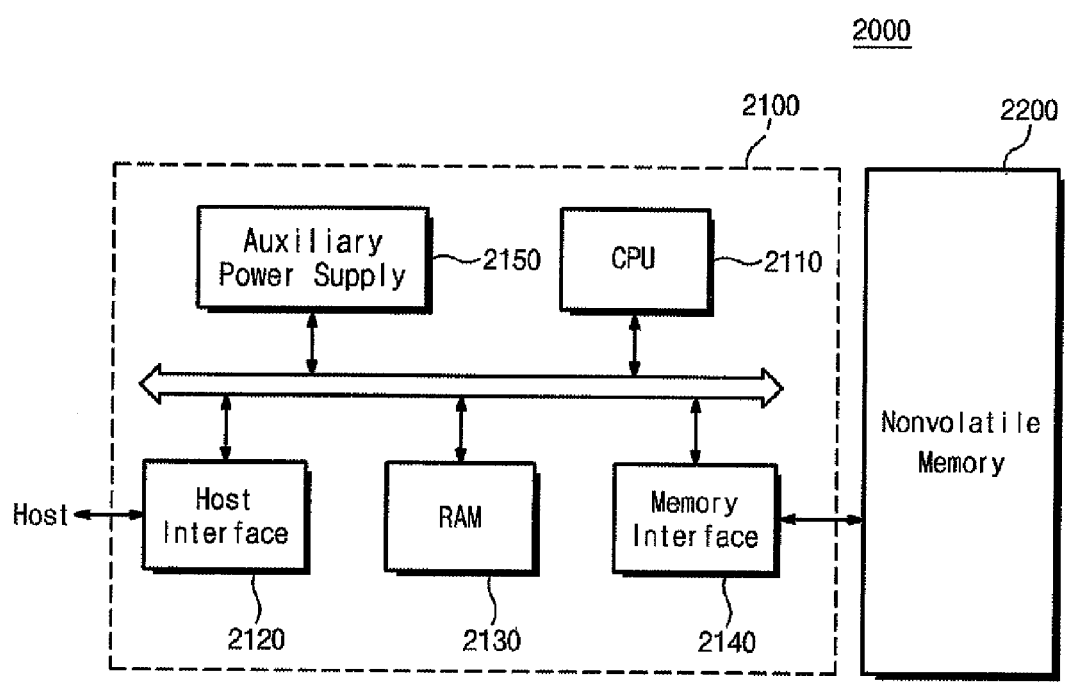
FIG. 12 is a block diagram of a data storage system comprising a nonvolatile memory device according to an embodiment of the inventive concept.

FIG. 12 is a block diagram of a data storage system 2000 comprising a nonvolatile memory device according to an embodiment of the inventive concept. In the embodiment of FIG. 12, data storage system 2000 comprises a memory controller 2100 and a nonvolatile memory 2200. Data storage system 2000 comprises all storage medium such as memory card, such as an SD or MMC card or a removable portable storage device, such as a USB memory.

Referring to FIG. 12, memory controller 2100 comprises a central processing unit (CPU) 2100, a host interface 2120, a random access memory (RAM) 2130, a flash interface 2140, and an auxiliary power supply 2150. Auxiliary power supply 2150 can be located inside or outside the memory controller 2100.

Data storage system 2000 is operated while connected to a host. Data storage system 2000 transfers/receives data to/from the host through host interface 2140. Data storage system 2000 receives power from the host to perform internal operations. Nonvolatile memory device 2200 shown in FIG. 12 comprises a nonvolatile memory device, such as nonvolatile memory 100 of FIG. 1.

Figure 13:
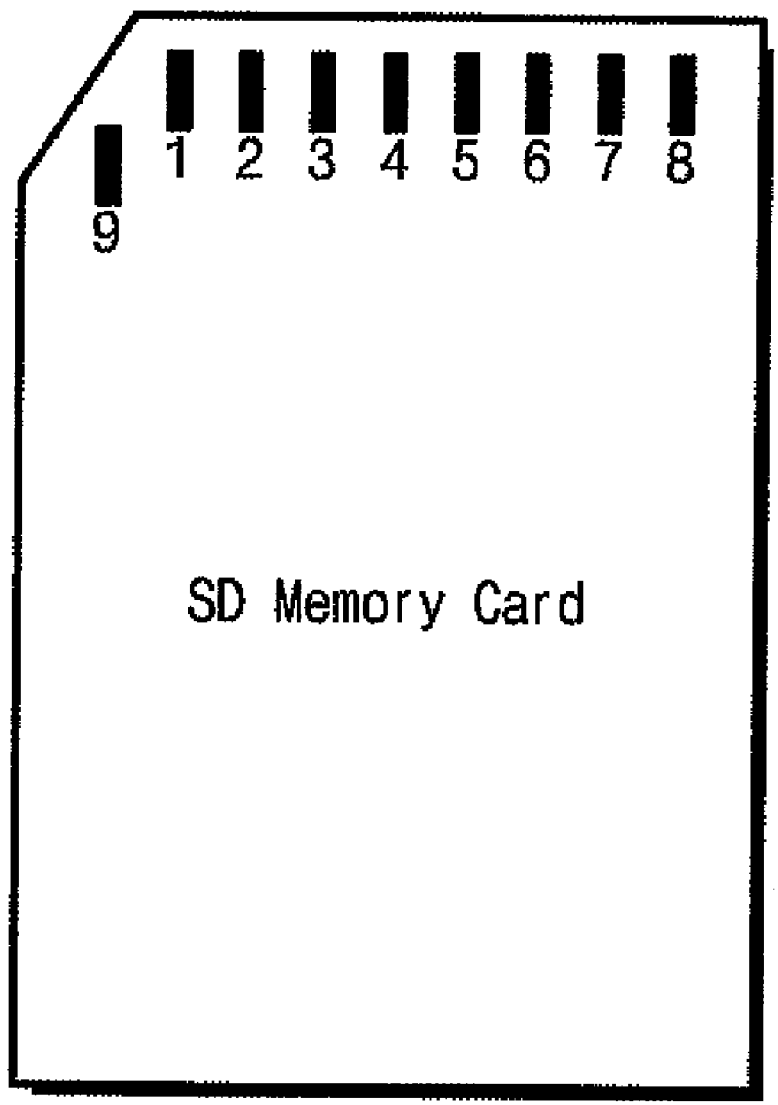
FIG. 13 is a diagram illustrating a memory card comprising a nonvolatile memory device according to an embodiment of the inventive concept.

FIG. 13 is a diagram illustrating a memory card comprising a nonvolatile memory device according to an embodiment of the inventive concept. More specifically, FIG. 13 shows the appearance of an SD card. The SD card comprises nine pins, which comprise four data pins 1, 7, 8, and 9, one command pin 2, one clock pin 5, and three power pins 3, 4, and 6.

A command and a response are transferred through the command pin. The command is transferred to the memory card from a host and the response is transferred to the host from the memory card.

Figure 14:
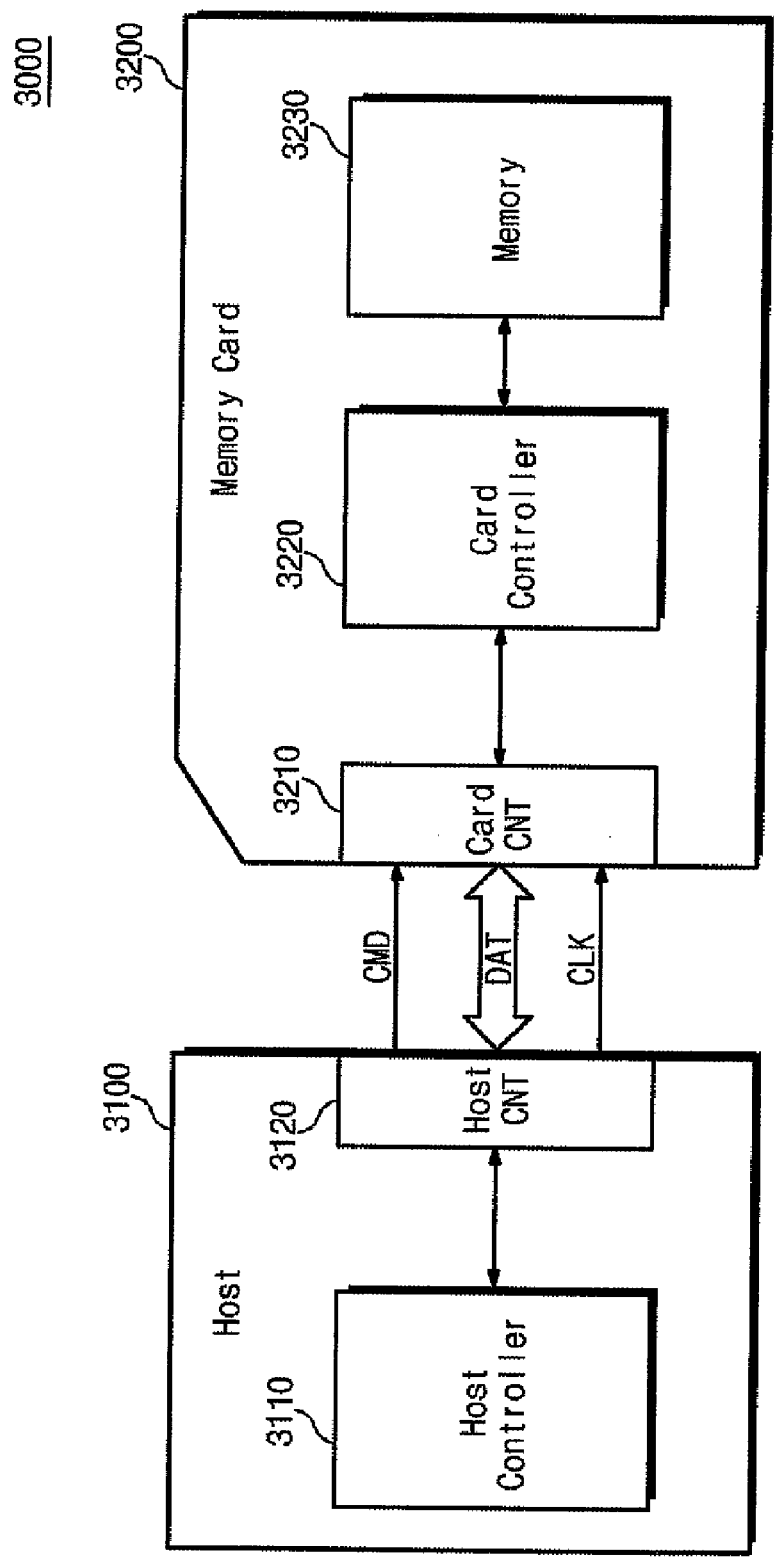
FIG. 14 is a block diagram illustrating an embodiment of the memory card shown in FIG. 13 and a connection between the memory card and a host.

FIG. 14 is a block diagram illustrating an embodiment of the memory card shown in FIG. 13 and a connection between the memory card and a host. Referring to FIG. 14, a memory card system 3000 comprises a host 3100 and a memory card 3200. Host 3100 comprises a host controller 3110 and a host connection unit 3120. Memory card 3200 comprises a card connection unit 3210, a card controller 3220, and a memory 3230.

Host connection unit 3120 and card connection unit 3210 comprise a plurality of pins, which comprise a command pin, a data pin, a clock pin, and a power pin. The number of pins can vary with the type of memory card 3200. For instance, an SD card comprises 9 pins.

Host 3100 writes data into memory card 3200 or reads data stored in the memory card 3200. Host controller 3110 transfers a command such as a write command, a clock signal CLK generated at a clock generator (not shown) in host 3100, and data DATA to memory card 3200 through card connection unit 3120.

Card controller 3220 stores data in memory 3230 in synchronization with a clock signal generated by the clock generator in card controller 3220 in response to a write command received through card connection unit 3210. Memory 3230 stores data transferred from host 3100. For instance, where host 3100 is a digital camera, memory 3230 can store image data. Memory 3230 can comprise a nonvolatile memory device such as those illustrated in FIGS. 1 through 9.

Figure 15:
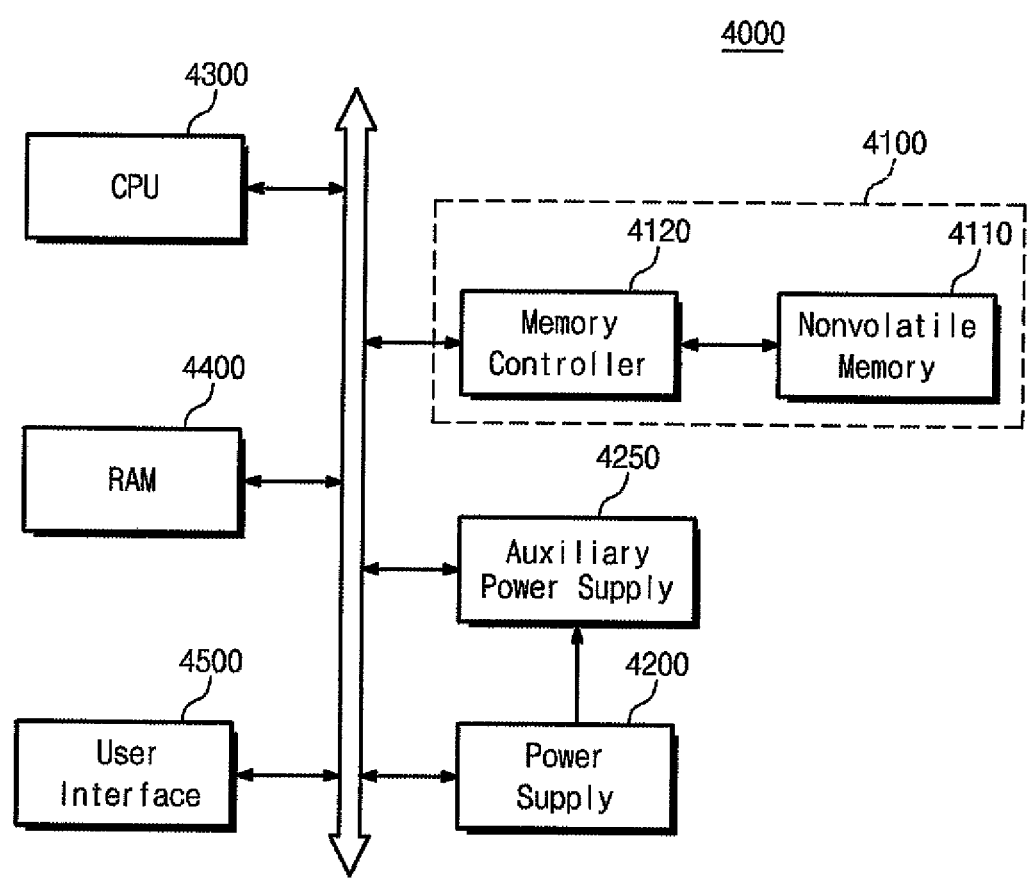
FIG. 15 is a block diagram of an electronic system comprising a nonvolatile memory device according to an embodiment of the inventive concept.

FIG. 15 is a block diagram of an electronic system 4000 comprising a nonvolatile memory device according to an embodiment of the inventive concept. Electronic system 4000 can take a variety of forms, such as a personal computer (PC) or a portable electronic device such as a notebook computer, a cell phone, a personal digital assistant (PDA), and a digital camera, to name just a few.

In the embodiment of FIG. 15, electronic system 4000 comprises a semiconductor memory device 4100, a power supply 4200, a central processing unit 4300, a RAM 4400, and a user interface 4500. Semiconductor memory device 4100 comprises a nonvolatile memory 4110 and a memory controller 4120. Nonvolatile memory 4110 comprises a nonvolatile memory such as those illustrated in FIGS. 1 through 9.

As indicated by the foregoing, various embodiments of the inventive concept use a multiple verify voltages in a single program loop of an ISPP scheme based on a threshold voltage shift distance of a program operation. This can reduce the number of program loops that are performed and can reduce programming time.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
    applying program voltage to a memory cell;
    determining a number of verify voltages to be applied to the memory cell based on a difference between a threshold voltage of an initial state of the memory cell and a threshold voltage of a target state; and
    applying the verify voltages to the memory cell to verify whether the memory cell is programmed to the target state.

2. The programming method of claim 1, wherein the number of verify voltages to be applied to the memory cell is at least two where the difference is greater than a reference value.

3. The programming method of claim 2, wherein the verify voltages to be applied to the memory cell comprise a pre-verify voltage that is higher than the threshold voltage of the initial state and lower than the threshold voltage of the target state, and a target verify voltage that is higher than the pre-verify voltage.

4. The programming method of claim 3, wherein a bitline forcing voltage is applied to a bitline connected to the memory cell during a next program loop if the threshold voltage of the memory cell after a current program loop is higher than the pre-verify voltage and lower than the target verify voltage.

5. The programming method of claim 3, wherein a ground voltage is applied to a bitline connected to the memory cell during a next program loop if the threshold voltage of the memory cell after a current program loop is lower than the target verify voltage.

6. The programming method of claim 3, wherein a program inhibit voltage is applied to a bitline connected to the memory cell during a next program loop if the threshold voltage of the memory cell after a current program loop is higher than the target verify voltage.

7. The programming method of claim 1, wherein the number of verify voltages to be applied to the memory cell is one where the difference is smaller than a reference value.

8. The programming method of claim 1, wherein the memory cell stores at least two bits of data.

9. The programming method of claim 1, wherein the nonvolatile memory device comprises a solid-state drive.

10. A method of programming a nonvolatile memory device using an incremental step pulse programming (ISPP) scheme, the method comprising:
    programming memory cells from an erase state to a first state having a verify voltage higher than the erase state, based on a least significant bit (LSB); and
    programming the memory cells from the first state to a second state having a verify voltage higher than the first state, based on a most significant bit (MSB), wherein programming the memory cells from the first state to the second state comprises selecting a number of verify voltages to be applied to the memory cells in one or more program loops of the ISPP scheme based on a difference between a threshold voltage of the first state and a threshold voltage of the second state.

11. The method of claim 10, wherein the number of verify voltages to be applied to the memory cells is at least two where the difference is greater than a reference value.

12. The method of claim 11, wherein the verify voltages to be applied to the memory cells comprises a pre-verify voltage that is higher than the threshold voltage of the first state and lower than the threshold voltage of the second state.

13. The method of claim 12, wherein a ground voltage is applied to a bitline connected to the memory cells programmed to the second state during a next program loop if a threshold voltage of the memory cells programmed to the second state is lower than the pre-verify voltage after a current program loop.

14. The method of claim 12, wherein a bitline forcing voltage is applied to a bitlines connected to the memory cells programmed to the second state during a next program loop if a threshold voltage of the memory cells programmed to the second state is higher than the pre-verify voltage and lower than a target verify voltage after a current program loop.

15. The method of claim 12, wherein a program inhibit voltage is applied to a bitline connected to the memory cells programmed to the second state during a next program loop if a threshold voltage of the memory cells programmed to the second state is higher than a target verify voltage after a current program loop.

16. The method of claim 10, wherein the number of verify voltages to be applied to the memory cell is one where the difference is smaller than a reference value.

17. The method of claim 10, wherein the memory cells are programmed from the erase state to the first state using a convergence program operation.

18. The method of claim 10, wherein at least one of the memory cells is a two-bit memory cell.

19. The method of claim 10, wherein the nonvolatile memory device comprises a solid-state drive.

20. A method of programming a nonvolatile memory device using an incremental step pulse programming (ISPP) scheme, the method comprising:
    determining a threshold voltage shift distance between a first threshold voltage state of a selected memory cell and a second threshold voltage state of the selected memory cell;
    comparing the threshold voltage shift distance against a reference value to determine whether the threshold voltage shift distance is greater than the reference value;
    as a consequence of determining that the threshold voltage shift distance is greater than the reference value, programming the selected memory cell from the first threshold voltage state to the second threshold voltage state by executing the ISPP scheme with at least one program loop using more than one verify voltage; and
    as a consequence of determining that the threshold voltage shift distance is not greater than the reference value, programming the selected memory cell from the first threshold voltage state to the second threshold voltage state by executing the ISPP scheme with at only one verify voltage in each program loop.

* * * * *